US 6,573,616 B2

(12) United States Patent
Yamane (10) Patent No.: US 6,573,616 B2
(45) Date of Patent: Jun. 3, 2003

(54) COOLING STRUCTURE FOR A VEHICLE CONTROL UNIT (75) Inventor: Shigeki Yamane, Nagoya (JP)

(73) Assignees: Autonetworks Technologies, Ltd., Nagoya (JP); Sumitomo Wiring Systems, Ltd., Mie (JP); Sumitomo Electric Industries, Ltd., Osaka (JP)

(*) Notice: Subject to any disclaimer, the term of this patent is extended or adjusted under 35 U.S.C. 154(b) by 92 days.

(21) Appl. No.: 09/818,865

(22) Filed: Mar. 28, 2001

(65) Prior Publication Data
US 2001/0035684 A1 Nov. 1, 2001

(30) Foreign Application Priority Data
Apr. 26, 2000 (JP) ......................................... 2000-125917

(51) Int. Cl.⁷ .................................................. B60L 1/00
(52) U.S. Cl. ...................................... 307/10.1; 361/703
(58) Field of Search ................................ 307/9.1, 10.1, 307/11, 38, 115; 361/703, 704, 719; 165/80.3, 185; 174/16.3

(56) References Cited

U.S. PATENT DOCUMENTS

| 3,906,920 A | * | 9/1975 | Hemphill | 123/146.5 A |
| 4,626,750 A | * | 12/1986 | Post | 318/139 |
| 5,304,845 A | * | 4/1994 | Lindquist et al. | 165/80.3 |
| 5,719,487 A | * | 2/1998 | Sato et al. | 322/28 |
| 5,848,168 A | * | 12/1998 | Shipps et al. | 381/71.5 |

FOREIGN PATENT DOCUMENTS

JP      2000-092819      3/2000

* cited by examiner

Primary Examiner—Brian Sircus
Assistant Examiner—Sharon A. Polk
(74) Attorney, Agent, or Firm—Oliff & Berridge, PLC

(57) ABSTRACT

In a cooling structure for a vehicle control unit in which semiconductor elements are housed in a case 34 made of a resin, such as a power distributor, a heat sink member 56 which is connected to the semiconductor elements in a heat transferable manner is disposed on an outer face of the case 34. A plurality of fins 56f are formed on a face of the heat sink member which is exposed to the outside of the case. Ribs 34f are formed on the outer face of the case. The ribs 34f cover end portions of the fins 56f in positions where the ribs are joined to the end portions of the fins, respectively.

4 Claims, 12 Drawing Sheets

COOLING STRUCTURE FOR A VEHICLE CONTROL UNIT

BACKGROUND OF THE INVENTION

1. Field of the Invention

The present invention relates to a cooling structure which is disposed in a control unit mounted on a vehicle, such as a power distributor or an electric junction box, and which is used for cooling control semiconductor elements housed in a case of the control unit.

2. Description of the Related Art

Recently, semiconductor elements (particularly, switching elements) are widely used as means for performing various electronic controls in a vehicle. Usually, such semiconductor elements are housed in a protective case. Since semiconductor elements generate a relatively large amount of heat, semiconductor elements are preferably provided with a cooling structure which efficiently dissipates the generated heat to the outside of the case. A conventional known cooling structure is disclosed in, for example, JP-A-2000-92819. In the cooling structure, semiconductor elements in a case are connected to a heat sink member made of a metal in a heat transferable manner, the heat sink member is exposed to the outside of the case, and heat radiating fins are formed on an exposed face of the member. According to this structure, heat generated by the semiconductor elements is dissipated to the outside of the case through the heat sink member, and, in the outside of the case, the heat sink member and hence the semiconductor elements are efficiently cooled by traveling wind caused by a vehicle.

In the structure, the fins are formed integrally with the heat sink member, and the fins and the heat sink member are integrally formed by a metal. When end portions of the fins are exposed while leaving sharp edges to remain on the end portions, there arises a situation which is not preferable for safety reasons. As means for ensuring safety, it may be contemplated to chamfer the edges of the fins. In order to conduct such a chamfering work to a level at which safety is sufficiently attained, however, considerable labor is required. In the case where a large number of fins are formed, particularly, a long time period must be spent for the chamfering work. Therefore, this measure inevitably involves a large increase of the production cost.

SUMMARY OF THE INVENTION

The invention has been conducted in view of such circumstances, and therefore an object of the invention is to provide a cooling structure for a vehicle control unit in which semiconductor elements are efficiently cooled by using a heat sink member having fins, and safety of end portions of the fins can be sufficiently ensured by a simple structure that can be worked without requiring much labor.

To achieve the above problem, according to the invention, there is provided a cooling structure for a vehicle control unit in which semiconductor elements are housed in a case made of a resin, wherein a heat sink member which is connected to the semiconductor elements in a heat transferable manner is disposed on an outer face of the case, a plurality of fins are formed on a face of the heat sink member, the face being exposed to an outside of the case, and ribs having a thickness which is substantially equal to a thickness of the fins are formed on the outer face of the case, the ribs covering end portions of the fins in positions where the ribs are joined to the end portions of the fins, respectively.

According to this configuration, heat generated by the semiconductor elements in the case is guided to the outside of the case through the heat sink member, and then subjected to efficient heat exchange with the outside air by the fins formed on the heat sink member.

In this configuration, end portions of the fins are covered by the ribs which are protrudingly formed in the outside of the case, and hence fingers of the worker can be surely prevented from touching the end portions of the fins. Even when a precision chamfering work is not conducted on the end portions of the fins, therefore, high safety can be ensured by the ribs which are formed outside the end portions. Moreover, the ribs are formed into a fin-like shape having a thickness which is substantially equal to that of the fins of heat sink member, and in positions where the ribs are joined to the fins, respectively. Consequently, ventilation to spaces between the fins is satisfactorily maintained, so that there arises no fear that the cooling performance is impaired.

The disposing region and area of the heat sink member can be freely set. In order to improve the cooling performance, however, it is preferable to set the disposing area to be large. For example, a configuration may be employed in which the heat sink member is disposed over a region except end portions of the case in a predetermined direction, and the ribs are formed in the end portions of the case. According to this configuration, safety of the end portions of the fins can be ensured by the ribs while effectively increasing the area of the heat sink member.

In the invention, the fins may have any specific shape. In order to allow the fins to be easily worked, it is preferable to form the fins into a shape which is as simple as possible. When the fins are formed into a linear shape elongating in the predetermined direction, for example, the whole of the heat sink member can be formed by extrusion.

The cooling structure of the invention can be applied to a wide variety of control units which are mounted on a vehicle, and into which semiconductor elements are incorporated, and is particularly effective in the case where semiconductor elements generate a large amount of heat. When the vehicle control unit is a vehicle power distributor which distributes an electric power from a power source mounted on a vehicle, to a plurality of portions to be powered and the semiconductor elements are semiconductor switching elements which are respectively connected between the power source and the portions to be powered, currents of a considerably high level flow through the semiconductor elements to generate a large amount of heat. Therefore, the invention is preferably applied to a cooling structure for such a power distributor. Specifically, the semiconductor elements may be connected to a common heat sink member in a heat transferable manner, whereby an excellent cooling effect can be attained.

DETAILED DESCRIPTION OF THE PREFERRED EMBODIMENTS

Preferred embodiments of the invention will be described with reference to the accompanying drawings. In the following description, examples in which the cooling structure of the invention is used in a power distributor which distributes an electric power from a power source mounted on a vehicle, to a plurality of electronic units will be shown. The invention exerts excellent effects not only in such a power distributor, but also in any vehicle control unit into which semiconductor elements that are to be cooled are incorporated, such as an electric junction box into which circuits configured by bus bar boards are incorporated and semiconductor switching elements for controlling the power supply to the circuits are built.

Figure 1:
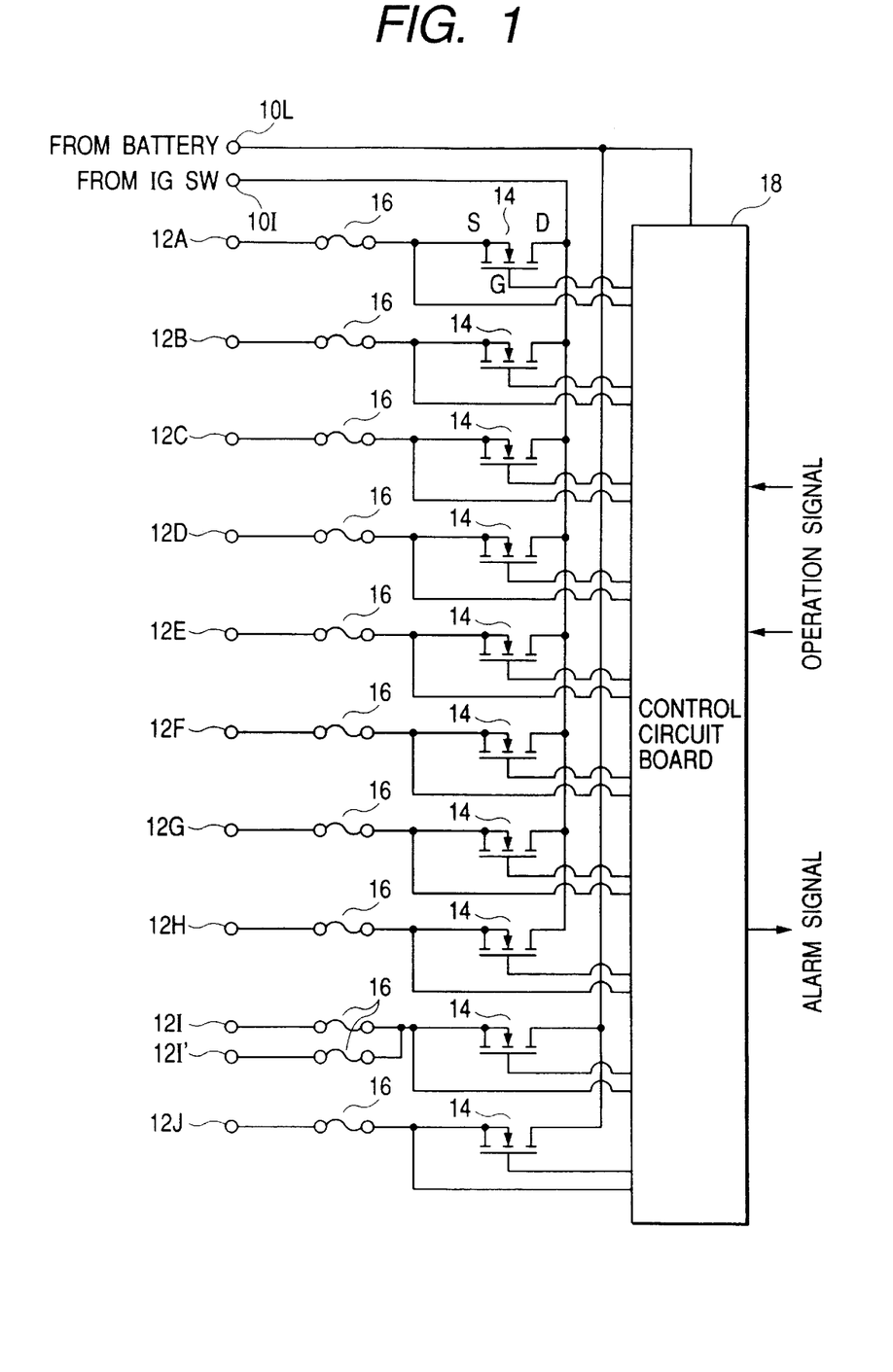
FIG. 1 is a circuit diagram of a power distributor according to an embodiment of the invention.

FIG. 1 shows the circuit configuration of a power distributor of the embodiment.

The illustrated power distributor has: two input terminals 10L and 10I; a plurality of output terminals 12A, 12B, 12C, 12D, 12E, 12F, 12G, 12H, 12I, 12I', and 12J; a plurality of semiconductor switching elements (in the illustrated example, power MOSFETs 14, hereinafter referred to merely as "FETs"); and a control circuit board 18.

The input terminals 10I and 10L are connected to a common on-vehicle power source (for example, a battery) The first input terminal 10I is connected to the on-vehicle power source via an ignition switch which is not shown, and the second input terminal 10L is connected directly to the on-vehicle power source.

Among the output terminals 12A to 12J, the output terminals 12A to 12H are respectively connected to electronic units (for example, a center cluster unit, an air conditioner unit, and a door unit) which are to be powered in response to an operation on the ignition switch. The other output terminals 12I, 12I', and 12J are connected to electronic units which are to be directly powered, such as a lamp unit.

The source terminals (second power supply terminals) of the FETs 14 are connected to the output terminals 12A, 12B, 12C, 12D, 12E, 12F, 12G, 12H, 12I, and 12J, respectively. The source terminal of the FET 14 which is connected to the output terminal 12I is connected also to the output terminal 12I'.

In the FETs 14, the drain terminals (first power supply terminals) of the FETs 14 which are connected to the output terminals 12A to 12H are connected to the input terminal 10I, and the drain terminals of the FETs 14 which are connected to the output terminals 12I, 12I', and 12J are connected to the input terminal 10L. Therefore, the power from the power source which is input to the first input terminal 10I is distributed through the FETs 14 to the electronic units connected to the output terminals 12A to 12H, and the power which is input to the second input terminal 10L is distributed through the FETs 14 to the electronic units connected to the output terminals 12I, 12I', and 12J.

The gate terminals of all the FETs 14 are connected to a control circuit of the control circuit board 18. The power source voltage applied to the second input terminal 10L, and the source voltages of the FETs 14 are input to the control circuit. The control circuit performs the power supply control on the FETs 14 on the basis of operation signals (a switch signal and the like) which are input from the outside, and the following control. From the potential difference between the power source voltage and the source voltage of each of the FETs 14, the control circuit detects the level of the current flowing through the FET 14. If the current level exceeds an allowable range, the FET 14 is turned off, and an alarm signal is output to a display device which is not shown.

A fuse portion 16 which doubly protects the corresponding circuit from an overcurrent is disposed in a middle portion of each of the output terminals 12A, 12B, 12C, 12D, 12E, 12F, 12G, 12H, 12I, 12I', and 12J.

Next, the specific structure of the power distributor will be described with reference to FIGS. 2 to 8.

Figure 2:
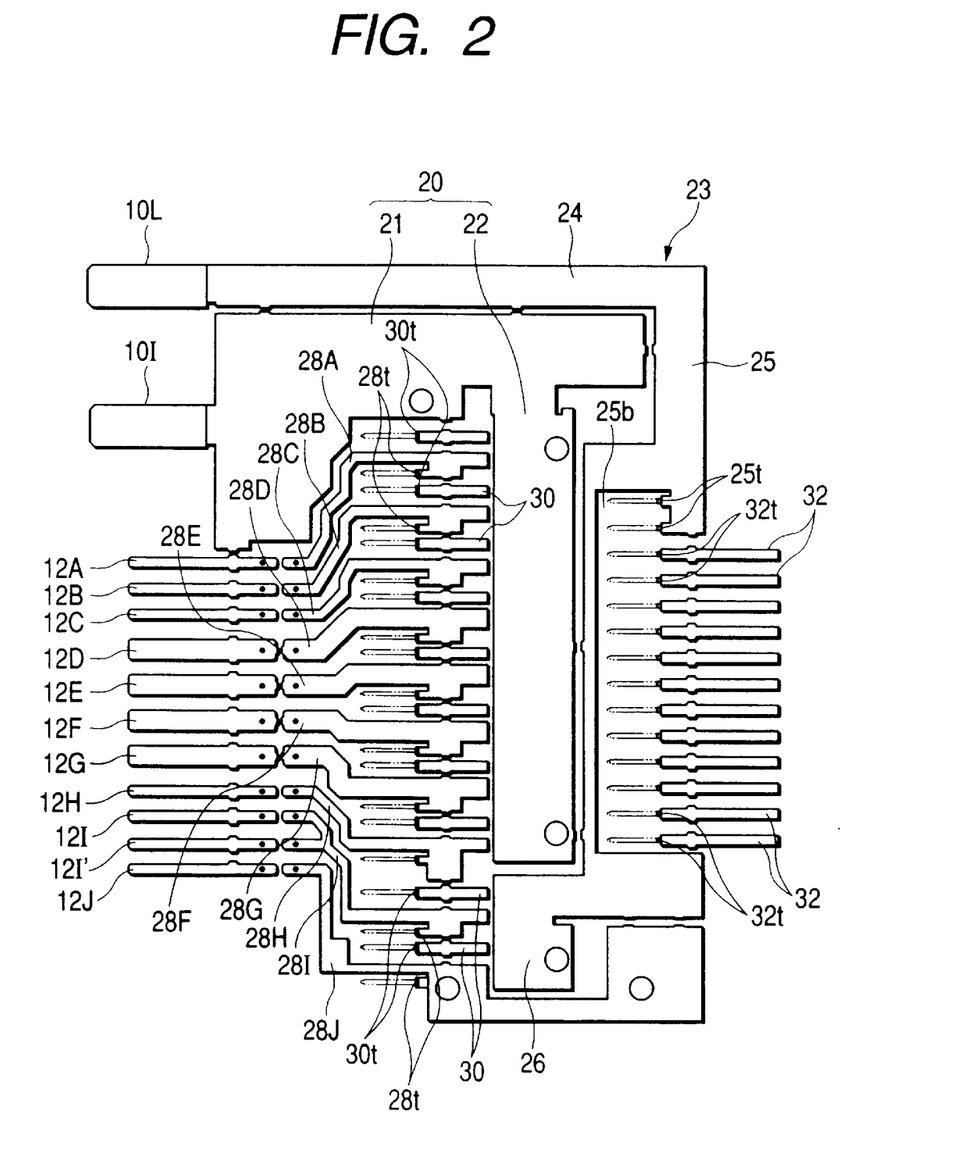
FIG. 2 is a plan view showing conductors of the power distributor.
Figure 3:
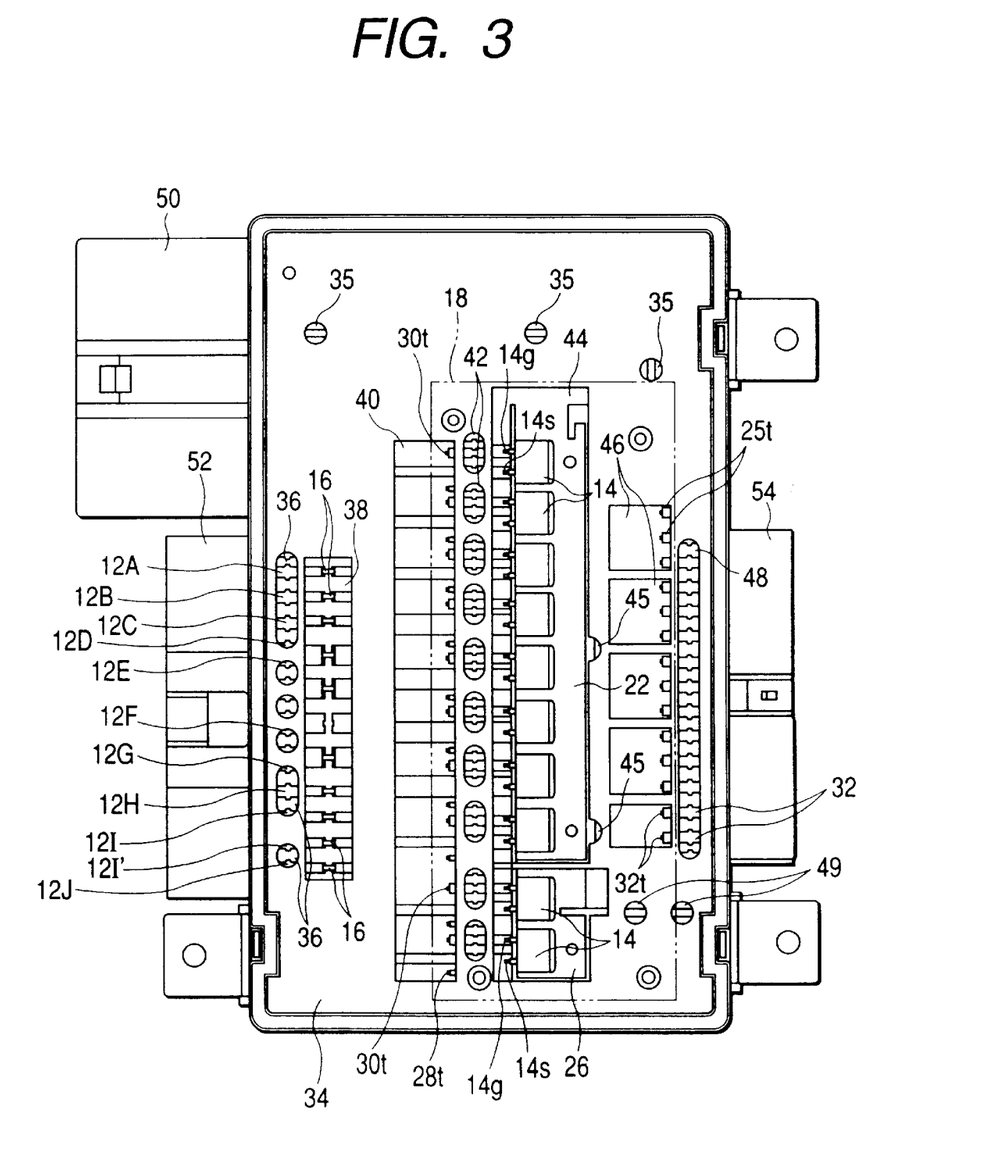
FIG. 3 is a plan view of the whole of the power distributor.

In the embodiment, all conductors constituting the power distributing circuit are configured by metal plates, and the metal plates are placed on the same plane which is perpendicular to the thickness direction of the plates, and integrated by resin molding. FIG. 2 is a plan view showing only a portion configured by the metal plates, with making the resin molded piece transparent.

As shown in the figure, the first input terminal 10I and the second input terminal 10L are formed integrally with metal plates 20 and 23, respectively.

The metal plate 20 integrally has: a intermediate portion 21 which elongates from the first input terminal toward the inner side (in FIG. 2, the right side); and a drain connection portion (conductor plate) 22 which elongates from the inner end of the intermediate portion 21 in a direction perpendicular to the intermediate portion 21.

The metal plate 23 integrally has: a first intermediate portion 24 which elongates from the second input terminal 10L in parallel with the intermediate portion 21 of the metal plate 20 with passing the outside (in FIG. 2, the upper side) of the intermediate portion 21; a second intermediate portion 25 which elongates from the inner end of the first intermediate portion 24 in parallel with the drain connection portion 22 with passing the outside (in FIG. 2, the right side) of the drain connection portion 22; and a drain connection portion 26 which forward elongates from an end of the second intermediate portion 25. The drain connection portion 26 and the drain connection portion 22 are aligned in a row along the longitudinal direction (the vertical direction of FIG. 2) of the drain connection portion 22.

All the output terminals 12A to 12J are laterally arranged in a row together with the input terminals 10I and 10L, and protrude in the same direction as the input terminals 10I and 10L. The rear portions of the output terminals 12A, 12B, 12C, 12D, 12E, 12F, 12G, 12H, 12I, and 12J are configured as intermediate portions 28A, 28B, 28C, 28D, 28E, 28F, 28G, 28H, 28I, and 28J which elongate to positions adjacent to the drain connection portions 22 and 26. With respect to the intermediate portions 28A to 28J, the drain connection portion 22 is placed in a position adjacent to the inner ends of the intermediate portions 28A to 28H, and the drain connection portion 26 is placed in a position adjacent to the inner ends of the intermediate portions 28I and 28J.

Control terminals 30 each configured by a strip-like metal plate are placed in positions adjacent to the intermediate portions 28A to 28J. As a result, in the sequence of the control terminal 30, the intermediate portion 28A, the control terminal 30, the intermediate portion 28B, the control terminal 30, . . . , the intermediate portions and the control terminals are laterally arranged in a row in an alternate manner.

Figure 5A:
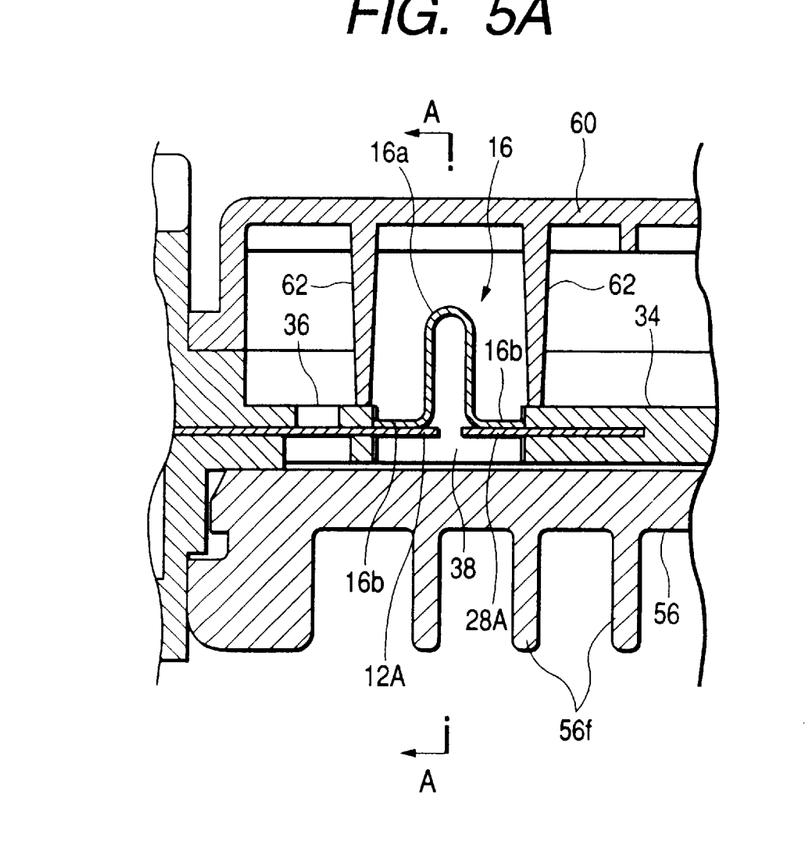
FIG. 5A is a front section view showing fuse portions in the power distributor.
Figure 5B:
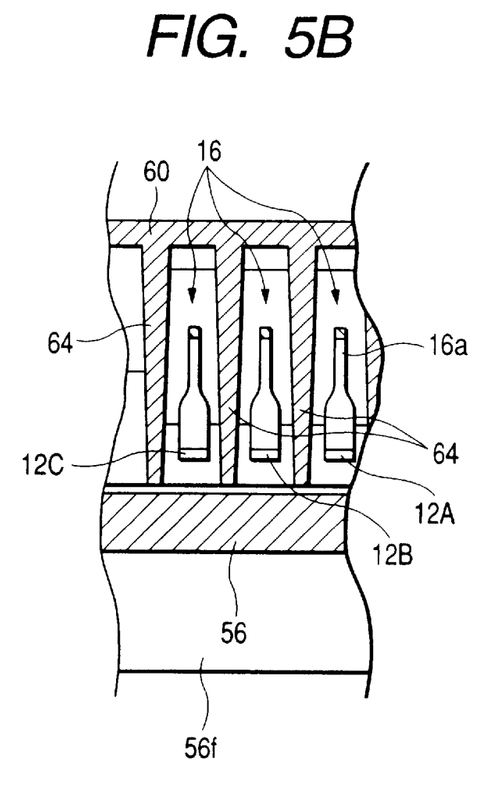
FIG. 5B is a section view taken along the line A—A of FIG. 5A.
Figure 6:
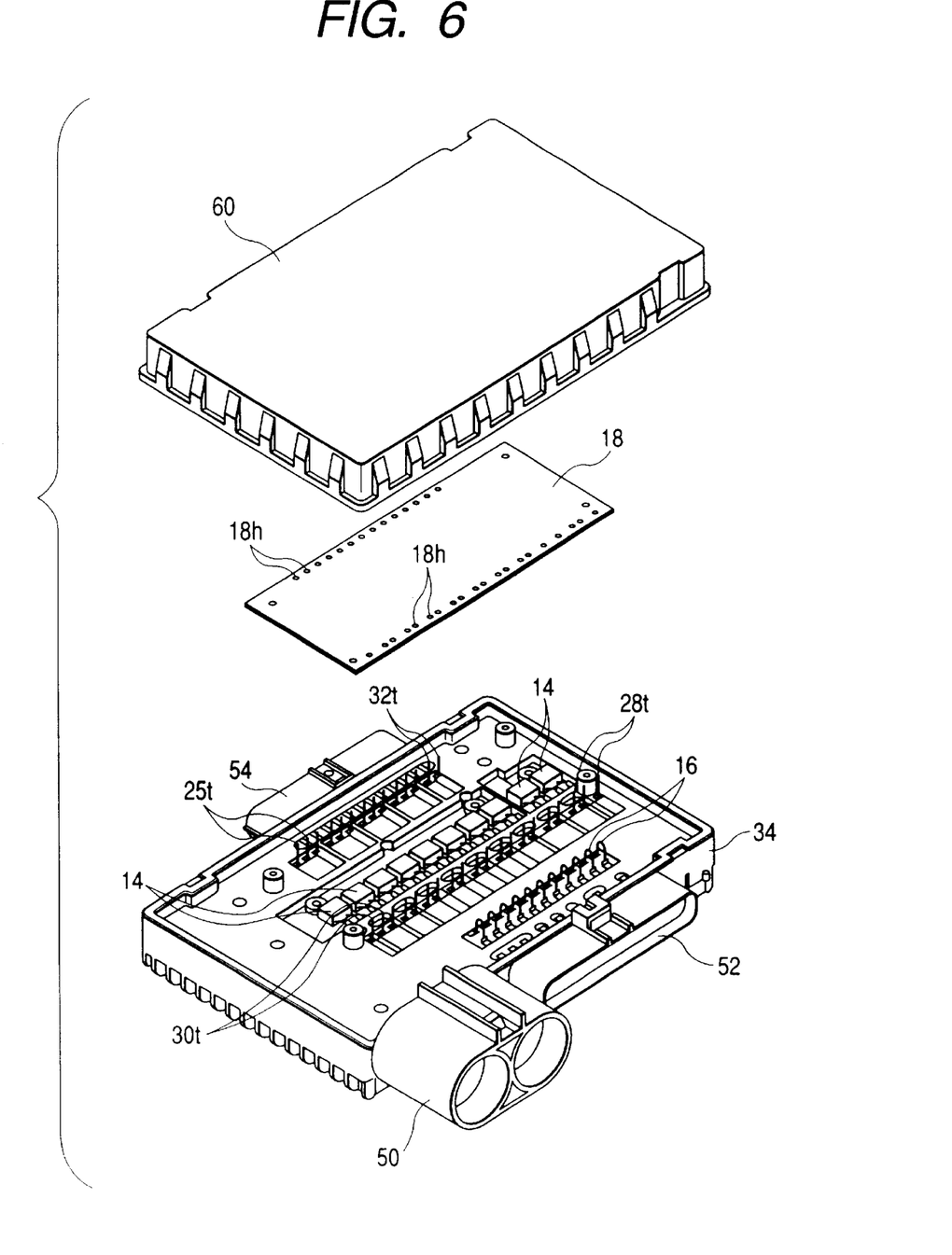
FIG. 6 is an exploded perspective view as seeing the power distributor from the upper side.

In the output terminals 12A to 12J, the intermediate portions 28A to 28J are cut off from the terminal main portions which are in front of the intermediate portions, and the fuse portions 16 are placed in the cut-off portions, respectively. Specifically, as shown in FIGS. 5A and 5B, a fuse member 16a is placed so as to connect end portions which are formed as a result of the cutoff, and both the end portions of the fuse member are respectively joined by welding or the like to the end portions which are formed by the cutoff.

Among the terminals of the FETs 14, the drain terminals (first power supply terminals) which are not shown are formed on the rear face of the chip body, and the source terminals (second power supply terminals) 14s and the gate terminals (power supply control terminals) 14g protrude from the chip body in the same direction. The FETs 14 are arranged in a row on the drain connection portions 22 and 26 in accordance with the arrangement of the intermediate portions 28A to 28J and the pitch of the arrangement. The FETs 14 are mounted on the drain connection portions 22 and 26 by welding or the like (for example, soldering) under a state where the drain terminals of the FETs 14 are in direct contact with the drain connection portions 22 and 26. The source terminals 14s of the FETs 14 are electrically connected to the rear ends of the intermediate portions 28A to 28J, and the gate terminals 14g to the rear ends of the control terminals 30 by means such as soldering, respectively.

Hook portions branch off from the rear ends of the intermediate portions 28A to 28J. The hook portions are upward bent to form tabs 28t. Similarly, hook portions are formed in the front portions of the control terminals 30, and upward bent to form tabs 30t.

On the other hand, in the second intermediate portion 25 of the metal plate 23, a rectangular cutaway 25b which elongates in parallel with the drain connection portion 22 is formed, and a plurality of signal terminals 32 are placed in the space of the cutaway 25b. The signal terminals 32 have a slender strip-like shape, are laterally arranged in a row in the longitudinal direction of the drain connection portion 22, and protrude in the direction (in FIG. 2, the rightward direction) opposite to the input terminals 10I and 10L and the output terminals 12A to 12J. Also the rear end portions of the signal terminals 32 are formed as hook portions. The hook portions are upward bent to form tabs 32t.

In the second intermediate portion 25 also, hook portions are formed in positions adjacent to the signal terminals 32, and upward bent to form tabs 25t. All of the tabs 25t and the above-mentioned tabs 28t, 30t, and 32t are connected to the common control circuit board 18.

Figure 4A:
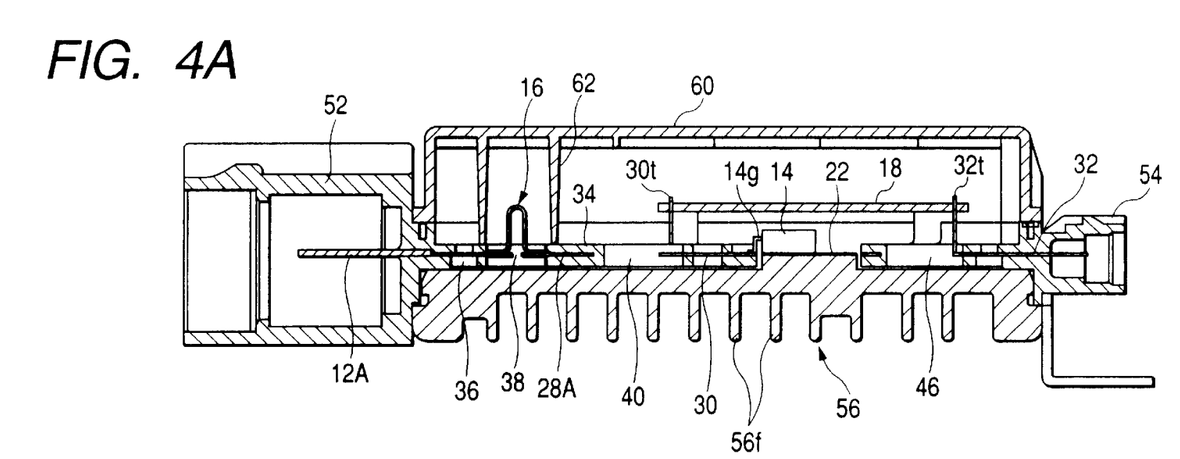
FIG. 4A is a front section view of the power distributor.
Figure 4B:
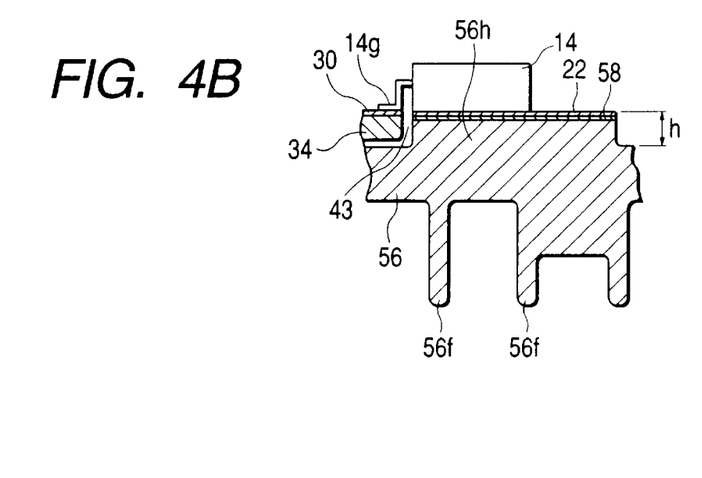
FIG. 4B is an enlarged section view of a portion where FETs are mounted.

As shown in FIG. 4, the control circuit board 18 is placed in a position (separated from the FETs 14) which is immediately above the FETs 14, in a state where the board is substantially parallel to the plane where the terminals are arranged (in the figure, a state where the board is substantially horizontal). For example, the tabs 28t, 30t, 32t, and 25t are soldered to through holes 18h formed in the control circuit board 18 in a state where the tabs are passed through the through holes 18h. As a result, the tabs are mechanically coupled to the control circuit board 18, and the output terminals 12A to 12J, the output terminals 12A to 12J, the signal terminals 32, and the second input terminal 10L are electrically connected to the control circuit built into the control circuit board 18. In other words, the control circuit board 18 is placed between the control terminals 30 and the signal terminals 32 so as to straddle the FETs 14.

The resin molded piece which integrates the terminals configures the case body 34 of the power distributor, and cooperates with a cover 60 which is to be attached to the body, to constitute a case for housing the FETs 14 and the control circuit board 18.

In adequate places of the case body 34, a plurality of windows which pass therethrough in the thickness direction are formed. Specifically, windows such as a rectangular fuse window 38 through which the cut-off portions of the output terminals 12A to 12J are exposed to the upper and lower sides, and an element window 44 through which the drain connection portions 22 and 26 are exposed to the upper and lower sides are formed. The fuse portions 16 are arranged in the fuse window 38, and the FETs 14 are mounted to the drain connection portions 22 and 26 in the element window 44.

Connector housing portions 50 and 52 are integrally formed on one side face of the case body 34, and a connector housing portion 54 is formed on the opposite side face. The connector housing portions 50, 52, and 54 have a hood-like shape which is opened to the outside. The input terminals 10I and 10L protrude into the connector housing portion 50, all the output terminals 12A to 12J protrude into the connector housing portion 52, and all the signal terminals 32 protrude into the connector housing portion 54. Connectors are fitted into the connector housing portions 50, 52, and 54, respectively, so that the input terminals 10I and 10L are electrically connected to the on-vehicle power source via a power source input wire harness, the output terminals 12A to 12J are electrically connected to appropriate electronic units via a power distribution wire harness, and the signal terminals 32 are connected to external electronic units, respectively.

On the other hand, the cover 60 has a shape in which the peripheral portion can be attached to the outer side face (in FIG. 4, the upper face) of the case body 34, and, in the attached state, the FETs 14 and the control circuit board 18 are covered from the outside. Partition walls 62 and 64 for individually isolating the fuse portions 16 are formed in adequate places of the inner side face of the cover 60.

Next, a cooling structure for the power distributor will be described.

On the rear face of the case body 34 (the face which is opposite to the control circuit board 18 across the plane on which the terminals are formed, or the upper face in FIG. 4), a heat sink member 56 is disposed in a region except end portions in a predetermined direction (in FIG. 2, the vertical direction).

The whole of the heat sink member 56 is integrally formed by a material of a high thermal conductivity (or a high specific heat) such as an aluminum alloy or a copper alloy. In the illustrated example, a member the whole of which is integrally formed by extrusion (i.e., which is uniform in section shape in the longitudinal direction) is used as the heat sink member.

The heat sink member 56 is placed in substantially parallel to the plane on which the terminals are formed, so as to cover the rear face of the case body 34. A large number of fins 56f which elongate in the arrangement direction (in FIGS. 4A and 4B, the depth direction) of the FETs 14 are formed on the face (in FIGS. 4A and 4B, the lower face) of the heat sink member 56 which is exposed to the outside. The fins 56f are parallel to each other and linearly formed. In the rear face of the case body 34, the heat sink member 56 is ensured to have a large area, so as to cover the whole region except the end portions in the direction along which the fins 56f elongate.

Figure 7:
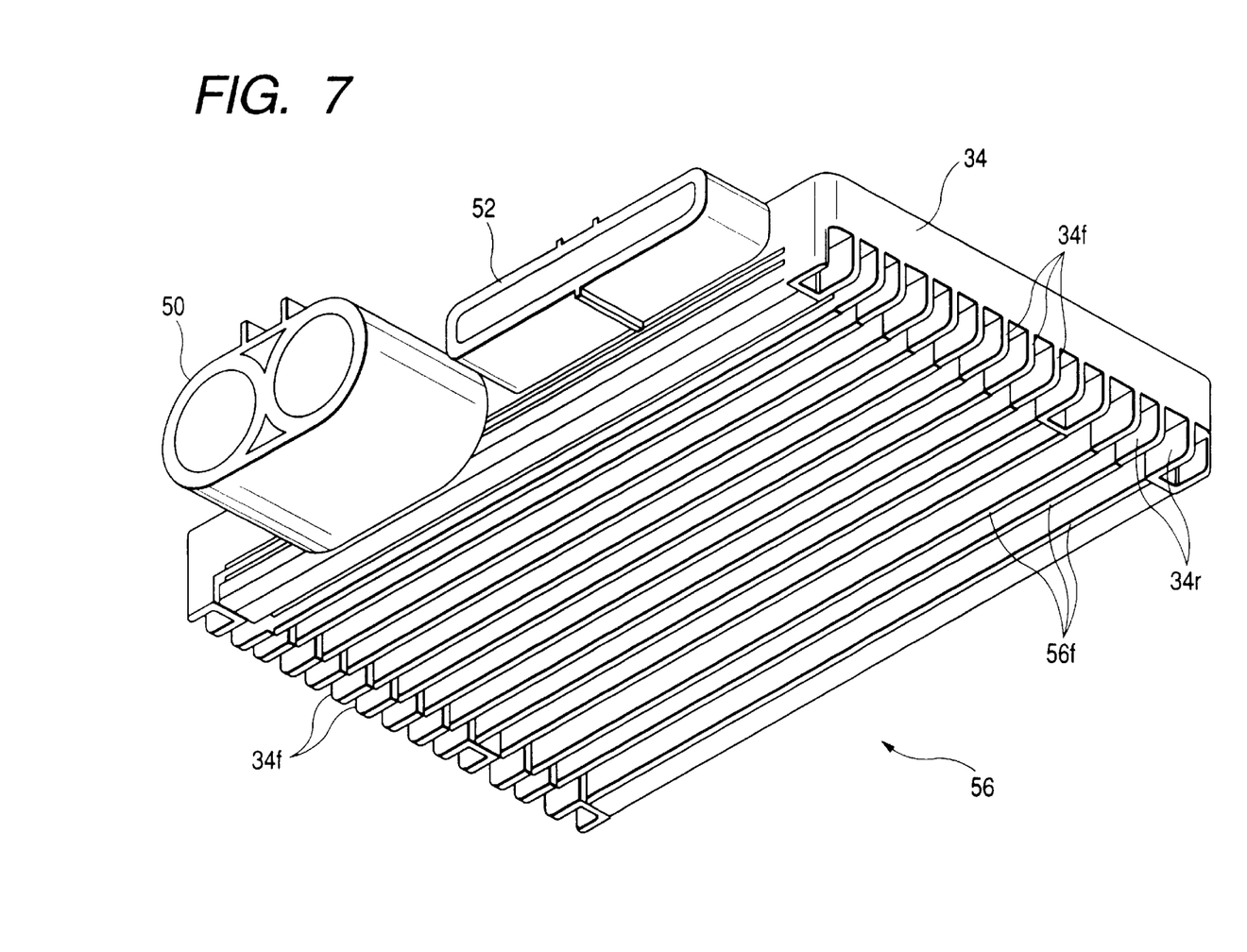
FIG. 7 is a perspective view as seeing the power distributor from the lower side.
Figure 8A:
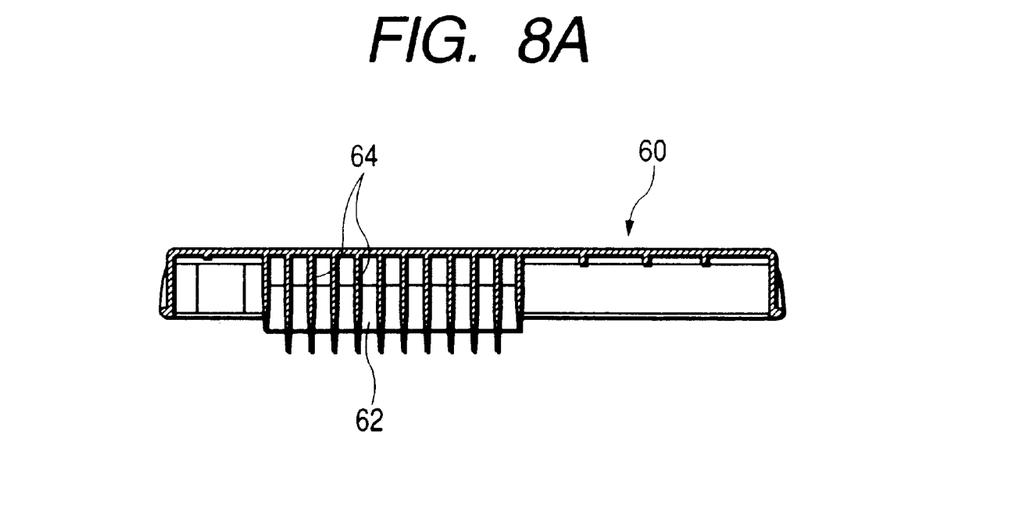
FIG. 8A is a front section view showing a cover of the power distributor.
Figure 8B:
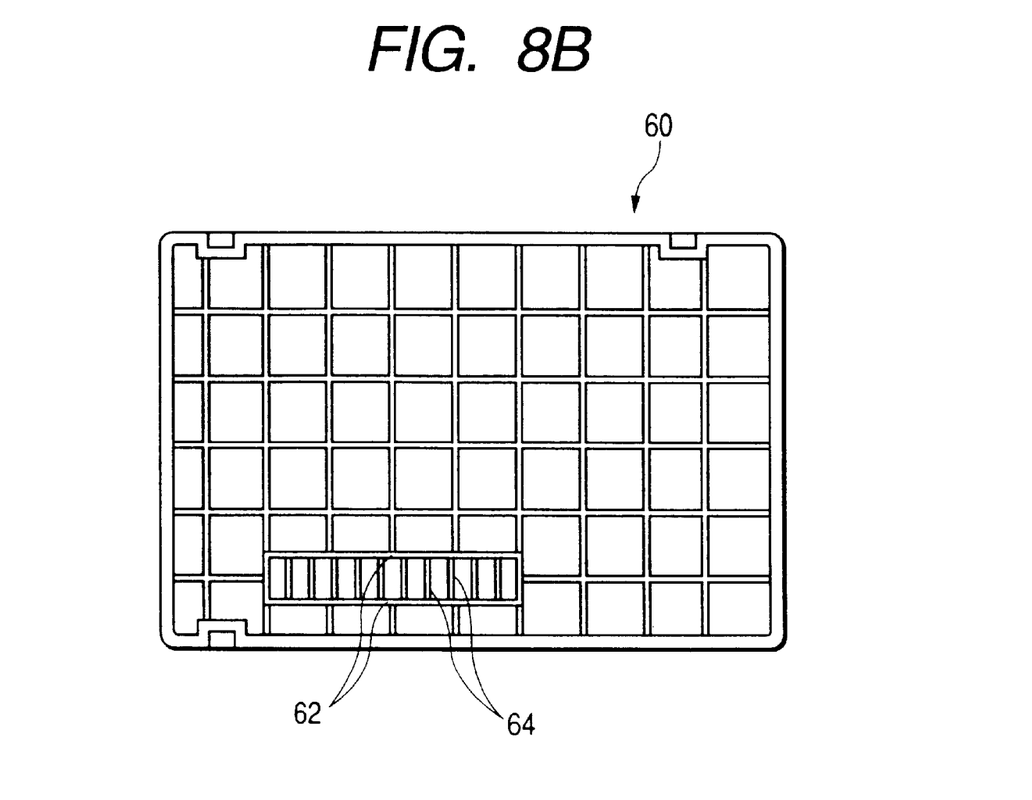
FIG. 8B is a bottom view of the cover.

By contrast, ribs 34f shown in FIG. 7 are formed integrally in the end portions of the case body 34 in the predetermined direction. The ribs 34f have a thickness which is substantially equal to that of the fins 56f, and are formed in positions where the ribs are joined to the end portions of the fins 56f in the longitudinal direction, respectively. The end portions of the fins 56f are laterally covered by the ribs 34f.

A table portion 56h which elongates in the arrangement direction of the FETs 14 upward protrudes form the inner side face (in FIG. 4, the upper face) of the heat sink member 56. By contrast, a window 43 which includes the element window 44, and which elongates in the arrangement direction of the FETs is formed in the lower face of the case body 34. In the window 43, the table portion 56h is inserted from the lower side into the element window 44 of the case body 34, and the rear faces of the drain connection portions 22 and 26 are thermally connected (in a heat transferable manner) to the surface of the table portion 56h via an insulation sheet 58 (FIG. 4B) made of silicone or the like. Therefore, the height h of the table portion 56h is set so that the source and gate terminals 14s and 14g of the FETs 14 mounted on the drain connection portions 22 and 26 which are thermally connected to the table portion 56h are positioned at the level at which the terminals can be connected to the output terminals 12A to 12J and the control terminals 30.

In the cooling structure described above, heat generated by the FETs 14 is transferred to the table portion 56h of the heat sink member 56 via the drain connection portions 22 and 26 on which the FETs 14 are mounted, and then subjected to efficient heat exchange with the outside air by the fins 56f formed on the outer surface of the heat sink member 56.

In both the outer sides of each of the fins 56f in the longitudinal direction, the ribs 34f to be joined to the end portions of the fins are formed integrally with the case body 34, and the end portions of the fin 56f are laterally covered by the rib 34f. Therefore, fingers or the like can be surely prevented from touching edges of the end portions of the fins 56f, so that, even when a special chamfering work is not conducted on the end portions of the fins 34 (or when only a very simple work is conducted), high safety can be ensured.

Moreover, the ribs 34f are formed into a fin-like shape having a thickness which is substantially equal to that of the fins 56f, and in positions where the ribs are joined to the fins 56f. Consequently, ventilation to spaces between the fins 56f is satisfactorily maintained, so that there arises no fear that the presence of the ribs 34f impairs the cooling performance.

The ribs 34f are formed integrally with the case body 34, and their shape can be freely set by adequately designing molding dies or the like. For example, as illustrated, edge portions of the ribs 34f may be configured by curved faces 34r of a large curvature, whereby safety can be further enhanced.

Figure 9:
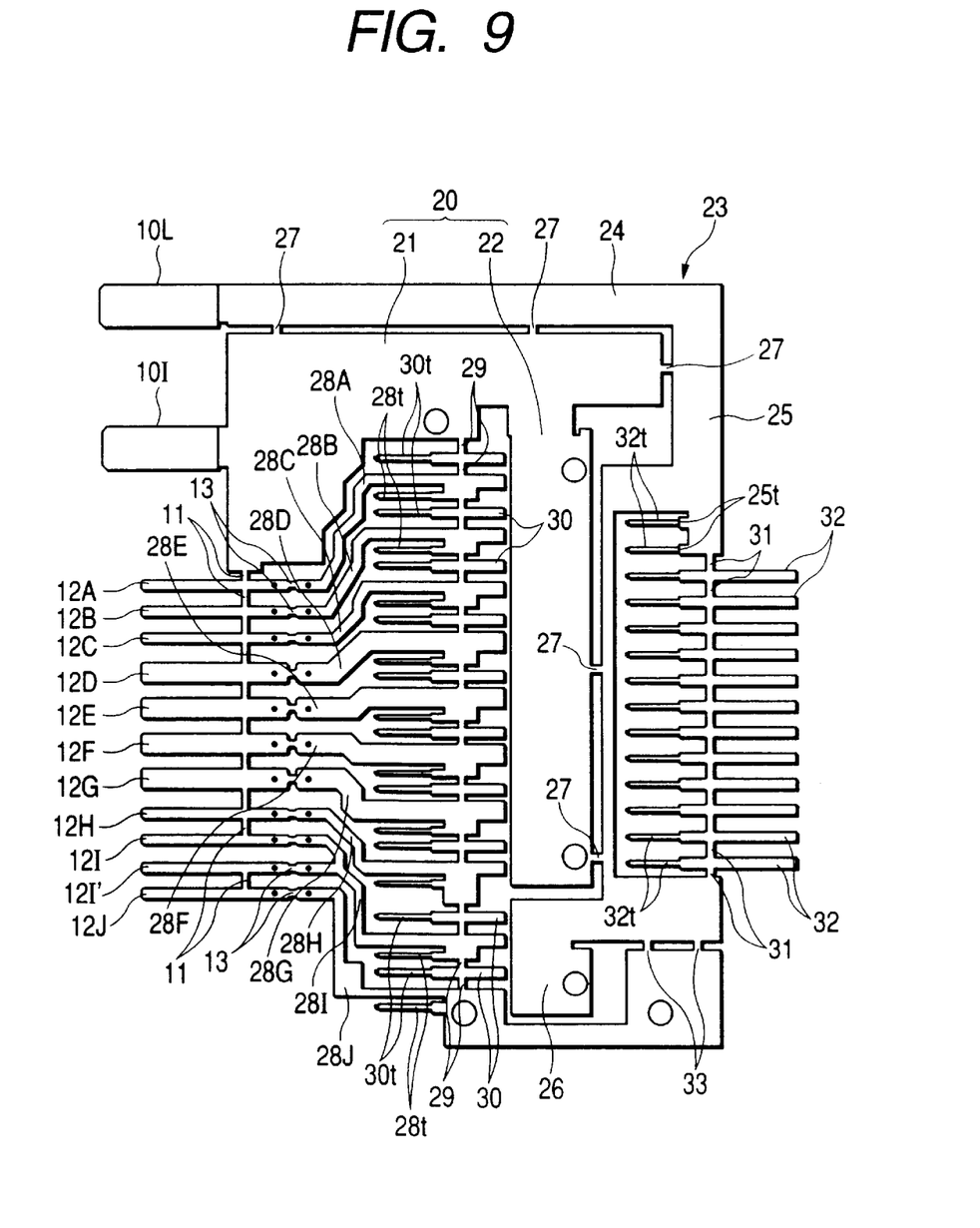
FIG. 9 is a plan view showing the shape of an original plate which is punched out in a punching step in a method of producing the power distributor.
Figure 10:
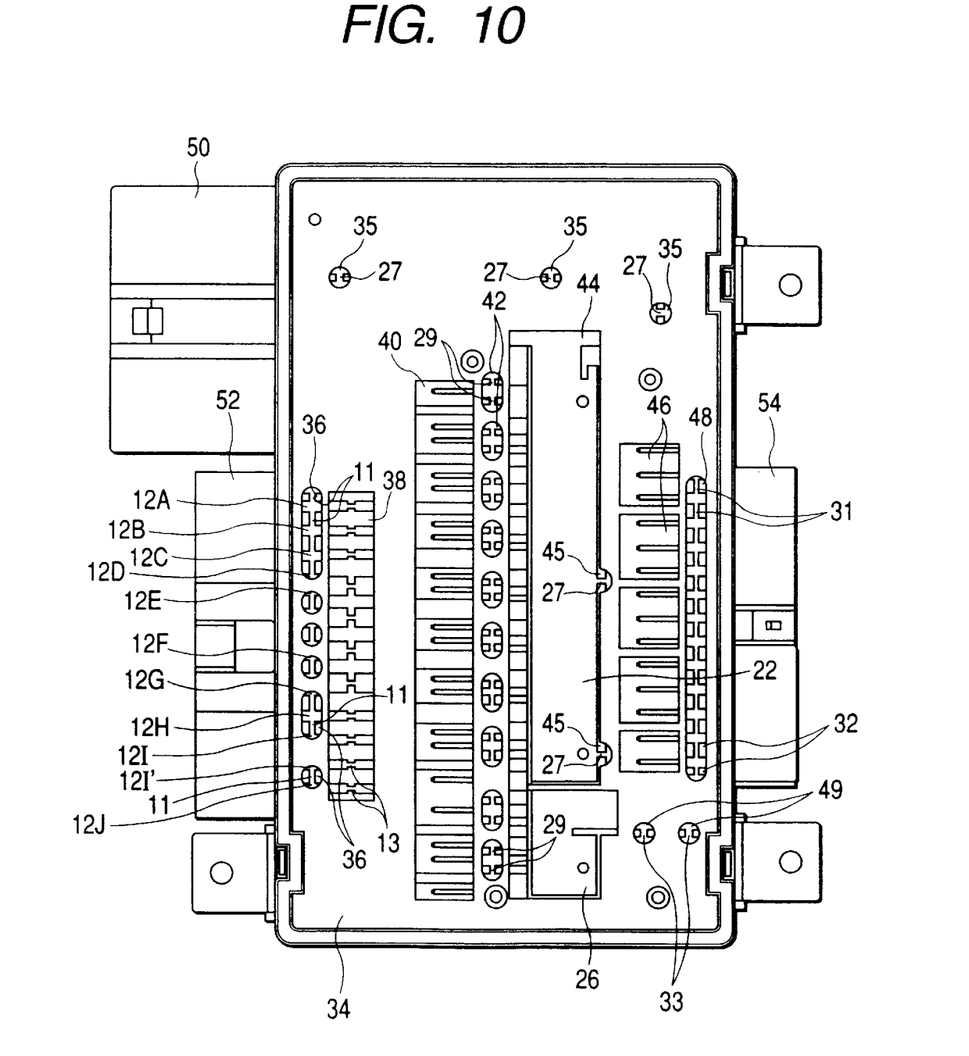
FIG. 10 is a plan view showing a resin molded piece which is obtained by conducting a resin molding process on the outer side of the original plate.
Figure 11:
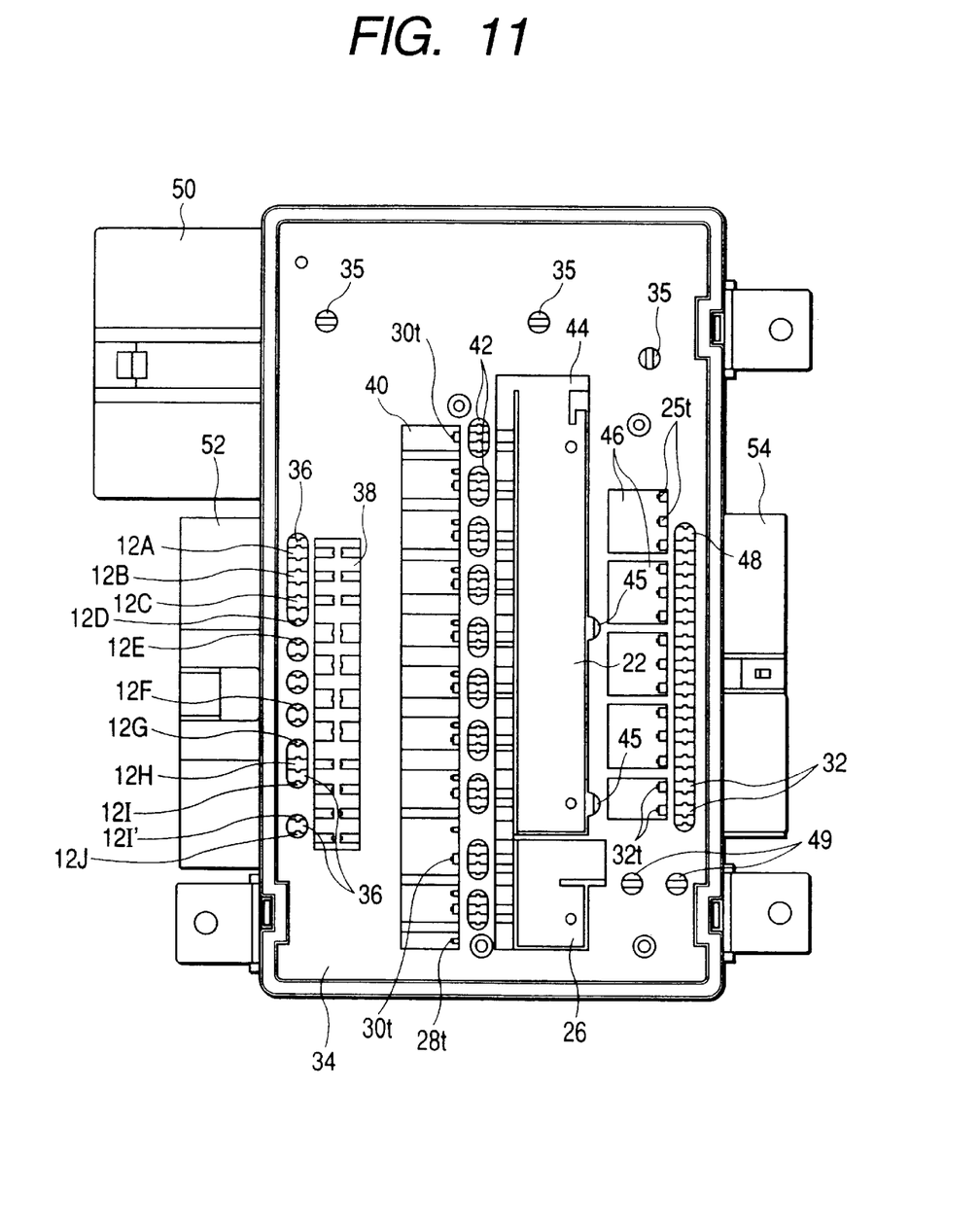
FIG. 11 is a plan view showing a state where joining portions of the original plate are cut off through a window formed in the resin molded piece, and tabs are upward bent.

For example, the body of the power distributor in the embodiment can be produced by the following method. The method comprises: a punching step of punching a single metal plate into a predetermined shape by, for example, a press machine to produce an original plate (FIG. 9) in which all of the metal plates 20 and 23 including the input terminals 10I and 10L, the output terminals 12A to 12J, the intermediate portions 28A to 28J of the output terminals, the control terminals 30, and the signal terminals 32 are integrally joined to one another; a molding step of conducting a resin molding process on the outer side of the original plate to produce a molded piece shown in FIG. 10; a step of cutting off joining portions 27, 11, 28, 31, and 33 of the original plate through cutoff windows 35, 36, 42, 48, and 49 which are previously formed in the resin molded piece, and upward bending the hook portions in terminal windows 40 and 46 to form the tabs 28t, 30t, 25t, and 32t; a mounting step of mounting the FETs 14 in the element window 44 of the resin molded piece; a step of inserting the tabs into the through holes 18h of the control circuit board 18 to attach the control circuit board 18; and a step of incorporating the fuse members 16a through the fuse window 38.

On the other hand, the heat sink member 56 can be integrally formed by casting or the like. When the fins 56f are linearly formed in parallel with one another as described above, the longitudinal direction of the fins may be made coincident with that of the table portion 56h (in the case where the table portion 56h is not formed, the fins can be oriented in any direction), thereby enabling the heat sink member 56 to be formed by extrusion. Namely, the heat sink member 56 can be mass-produced by a very simple method in which a long extruded product having a section shape which is identical with that of the heat sink member 56 is produced and the product is cut off by an appropriate size.

The heat sink member 56 is attached to the rear face of the case body 34 so as to cover the rear face, and fixed to the case body 34 by bolts or the like while maintaining insulation between the conductors molded integrally with the case body 34, and the heat sink member 56. During this fixation, the table portion 56h protruding from the heat sink member 56 is inserted into the window 43 of the case body 34, and thermally connected to the drain connection portions (conductor plates) 22 and 26 of the metal plates 20 and 23 via the insulation sheet 58, whereby the cooling structure is completed.

The invention is not restricted to the embodiment described above. For example, the invention may be implemented as the following embodiments.

In the invention, the useful semiconductor elements are not restricted to the power MOSFETs. The invention may be applied to cooling of various kinds of semiconductor elements which can be incorporated into a circuit for a vehicle, such as other kinds of transistors (for example, IGBTs or conventional bipolar transistors), and various kinds of thyristors including GTOs. Such semiconductor elements are not limited to packaged elements, and may be used in, for example, the form in which semiconductor chips are directly mounted.

In the invention, only the end portions of the fins in one side may be covered by the ribs of the case, and the end portions in the other side may be chamfered in a degree at which sufficient safety is ensured. In this case, it is not required to precisely chamfer the end portions in one side. Therefore, the production cost can be lowered by the elimination of the chamfering work.

Figure 12:
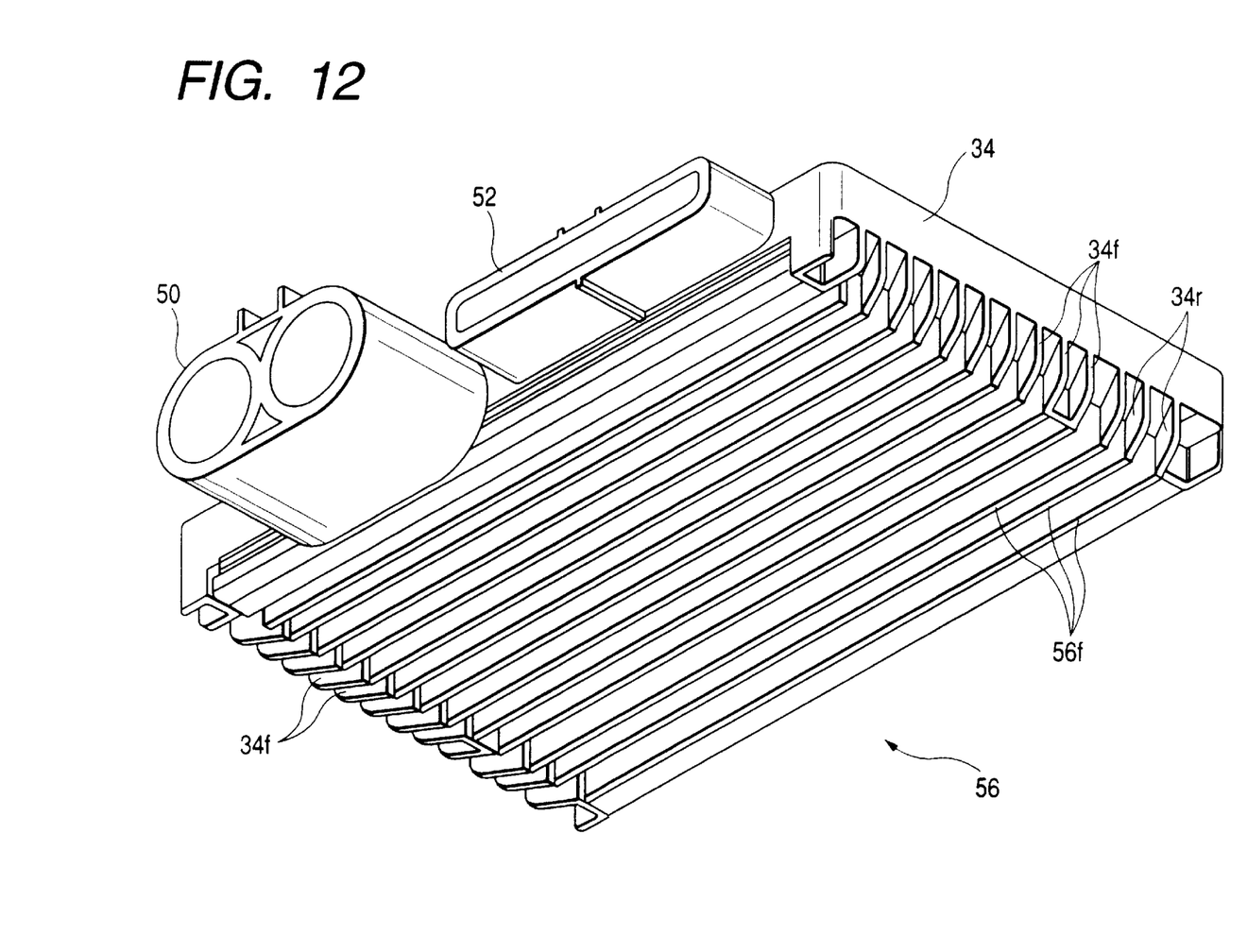
FIG. 12 is a view showing a modification of the power distributor of the embodiment of the invention.

In the invention, the ribs 34*f* are required only to be joined to the end portions of the fins 56*f*, and the direction of the ribs 34*f* may not be coincident with that of the fins 56*f*. As shown in FIG. 12, for example, the ribs 34*f* may be inclined with respect to the fins 56*f* by a predetermined angle so as to be easily exposed to the airflow.

In the invention, also the specific shape of the heat sink member 56 may be freely set. For example, a plurality of heat sink members may be separately placed, and semiconductor elements may be appropriately distributed to the heat sink members. When a shape in which a substantially whole of the rear face of the case body 34 is covered as described above is employed, it is possible to ensure a large heat radiation area while maintaining the thin structure. In the embodiment described above, the drain connection portions 22 and 26 on which the FETs 14 are mounted are used as media for electrical connection with the input terminals, and also as those for thermal connection with the heat sink member 56. In the invention, the semiconductor elements may be mounted on a heat transfer member dedicated to thermal connection, and their power supply terminals on the input side may be electrically connected to input terminals or the like by other means (for example, resistance welding).

As described above, in the invention, a heat sink member having plural fins is disposed on the outer face of a resin-made case which houses semiconductor elements, ribs having a thickness which is substantially equal to that of the fins are formed on the outer face of the case, and the ribs cover end portions of the fins in positions where the ribs are joined to the end portions of the fins, respectively. Therefore, the invention attains an effect that high safety of the end portions of the fins can be ensured by the simple structure in which the ribs to be joined to the fins are formed on the outer face of the case, while the semiconductor elements are efficiently cooled by the heat sink member having the fins.

What is claimed is:

1. A cooling structure for a vehicle control unit in which semiconductor elements are housed in a case made of a resin, said cooling structure comprising:

a heat sink member connected to said semiconductor elements in a heat transferable manner and disposed on an outer face of said case;

a plurality of fins formed on a face of said heat sink member, said face being exposed to an outside of said case; and a plurality of ribs having a thickness which is substantially equal to a thickness of said fins are formed on said outer face of said case, said ribs covering end portions of said fins in positions where said ribs are joined to said end portions of said fins, respectively.

2. The cooling structure for a vehicle control unit according to claim 1, wherein said heat sink member is disposed over a region except end portions of said case in a predetermined direction, and said ribs are formed in said end portions of said case.

3. The cooling structure for a vehicle control unit according to claim 2, wherein said heat sink member has linear fins which elongate in the predetermined direction, and a whole of said heat sink member including said linear fins is formed by extrusion.

4. The cooling structure for a vehicle control unit according to claim 1, wherein said vehicle control unit is a vehicle power distributor which distributes an electric power from a power source mounted on a vehicle, to a plurality of portions to be powered, said semiconductor elements are semiconductor switching elements which are respectively connected between said power source and said portions to be powered, and said semiconductor switching elements are connected to a common heat sink member in a heat transferable manner.

\* \* \* \* \*